United States Patent
Raguin et al.

(10) Patent No.: US 9,893,102 B2
(45) Date of Patent: Feb. 13, 2018

(54) AMBIENT LIGHT ILLUMINATION FOR NON-IMAGING CONTACT SENSORS

(71) Applicants: Daniel H. Raguin, North Palm Beach, FL (US); John F. Carver, Palm City, FL (US)

(72) Inventors: Daniel H. Raguin, North Palm Beach, FL (US); John F. Carver, Palm City, FL (US)

(73) Assignee: CROSS MATCH TECHNOLOGIES, INC., Palm Beach Gardens, FL (US)

( * ) Notice: Subject to any disclaimer, the term of this patent is extended or adjusted under 35 U.S.C. 154(b) by 571 days.

(21) Appl. No.: 13/676,062

(22) Filed: Nov. 13, 2012

(65) Prior Publication Data

US 2013/0119237 A1    May 16, 2013

Related U.S. Application Data

(60) Provisional application No. 61/559,071, filed on Nov. 12, 2011.

(51) Int. Cl.
*H01L 27/146* (2006.01)
*G06K 9/00* (2006.01)

(52) U.S. Cl.
CPC .... *H01L 27/14601* (2013.01); *G06K 9/00046* (2013.01); *H01L 27/14629* (2013.01); *H01L 27/14678* (2013.01); *H01L 27/14625* (2013.01)

(58) Field of Classification Search
CPC ............. H01L 27/146; H01L 27/14601; H01L 27/14678; H01L 27/14629;

(Continued)

(56) References Cited

U.S. PATENT DOCUMENTS

| 5,726,443 A | 3/1998 | Immega et al. |
| 5,737,071 A | 4/1998 | Arndt |

(Continued)

FOREIGN PATENT DOCUMENTS

| WO | WO 03/071345 | 8/2003 |
| WO | WO 2010-051041 | 5/2010 |
| WO | WO 2005/026938 | 12/2010 |

OTHER PUBLICATIONS

DpiX Technology, dpiX, LLC, printout from www.dpix.com/tech.html, 2010.

(Continued)

*Primary Examiner* — Georgia Y Epps
*Assistant Examiner* — Don Williams
(74) *Attorney, Agent, or Firm* — Lukacher Law Group; R. S. Rosenholm

(57) ABSTRACT

A sensor is provided for capturing images of skin topology having an upper surface providing a platen, and a one or two-dimensional array of light sensing pixel elements for receiving light representative of the topology of skin when upon the upper surface and illuminated by at least redirected ambient light received within the sensor through the upper surface. One or more layers or coatings of reflective or scattering materials are provided in the sensor for redirecting ambient light by one or more of reflection, scattering, or propagation towards the platen to illuminate the skin. The pixel elements are sensitive to one or more selected wavelengths or wavelength ranges of the ambient light present. Optional light source(s) may be provided for use when ambient light present is inadequate for proper sensor operation.

15 Claims, 6 Drawing Sheets

(58) Field of Classification Search
CPC .......... H01L 27/14625; G06K 9/00046; G06K 9/00; H04N 7/18; G01B 11/24
See application file for complete search history.

(56) References Cited

U.S. PATENT DOCUMENTS

| | | | |
|---|---|---|---|
| 5,828,773 A | | 10/1998 | Setlak et al. |
| 5,953,441 A | | 9/1999 | Setlak |
| 5,986,746 A | * | 11/1999 | Metz et al. ............... 356/71 |
| 5,991,467 A | * | 11/1999 | Kamiko ............ G06K 9/0004 250/208.1 |
| 6,128,399 A | | 10/2000 | Calmel |
| 6,175,641 B1 | | 1/2001 | Kallo et al. |
| 6,327,376 B1 | | 12/2001 | Harkin |
| 6,423,973 B2 | | 7/2002 | Choo et al. |
| 6,587,233 B1 | | 7/2003 | Salgado |
| 6,774,396 B1 | | 8/2004 | Chang et al. |
| 6,791,091 B2 | | 9/2004 | Rodricks et al. |
| 7,369,690 B2 | | 5/2008 | Joo et al. |
| 2001/0030324 A1 | | 10/2001 | Morikawa et al. |
| 2003/0183019 A1 | | 10/2003 | Chae |
| 2003/0206287 A1 | * | 11/2003 | McClurg ............ G06K 9/2036 356/71 |
| 2004/0252867 A1 | | 12/2004 | Lan et al. |
| 2005/0229380 A1 | | 10/2005 | Deconde et al. |
| 2005/0281441 A1 | | 12/2005 | Martinsen et al. |
| 2006/0120573 A1 | | 6/2006 | Lori |
| 2006/0140456 A1 | | 6/2006 | Foundeur et al. |
| 2006/0159314 A1 | | 7/2006 | Foundeur et al. |
| 2006/0217915 A1 | | 9/2006 | Dinh |
| 2007/0125937 A1 | * | 6/2007 | Eliasson et al. ............... 250/221 |
| 2008/0157921 A1 | | 7/2008 | Hendriks et al. |
| 2008/0246952 A1 | * | 10/2008 | Fenrich ............. G06K 9/00046 356/71 |
| 2008/0253626 A1 | | 10/2008 | Shuckers et al. |
| 2009/0066345 A1 | | 3/2009 | Klauk et al. |
| 2009/0092290 A1 | | 4/2009 | Rowe |
| 2010/0060611 A1 | * | 3/2010 | Nie ............... 345/175 |
| 2010/0283756 A1 | * | 11/2010 | Ku et al. ............ 345/174 |
| 2010/0321341 A1 | | 12/2010 | Cho et al. |
| 2011/0142296 A1 | * | 6/2011 | Otsubo ............. G06K 9/00046 382/115 |
| 2012/0321149 A1 | | 12/2012 | Carver |

OTHER PUBLICATIONS

R.L. Weisfield, M.A. Hartney, R.A. Street, and R.B. Apte, "New Amorphous-Silicon Image Sensor for X-ray Diagnostic Medical Imaging Applications," Proc. SPIE Conf. On Physics of Medical Imaging, vol. 3336, pp. 444-452, 1998.

R.L. Weisfield, Amorphous Silicon TFT X-ray Image Sensors, IEEE Int. Electron Dev. Meeting (IEDM 1998) Technical Dig., pp. 21-24, 1998.

Supplementary Partial European Search Report (SPESR) for European Patent Application No. 12846878.2, was reported by European Patent Agent (Schmidbauer, Andreas, Konrad, Wager & Geyer), to Applicant on Mar. 30, 2016.

* cited by examiner

AMBIENT LIGHT ILLUMINATION FOR NON-IMAGING CONTACT SENSORS

This application claims the benefit of U.S. Provisional Patent Application No. 61/559,071, filed Nov. 12, 2012, which is herein incorporated by reference.

FIELD OF THE INVENTION

The present invention relates to non-imaging contact sensors, and especially to non-imaging contact sensors which can utilize ambient light for illumination. Such sensors are useful for fingerprint scanners, or for imaging any other skin topology or portion of skin (for example fingers, thumbs, palms, toes, etc.). The sensors are referred to herein as non-imaging contact sensors as they do not require optics (e.g., one or more lenses for affecting focusing and/or magnification over the sensor's entire field of view) to enable proper capture of light representative of skin topology on the sensor's light sensing pixel elements. Such non-imaging contact sensors are enhanced in their performance by utilizing ambient (artificial or natural) light and therefore can operate without illumination being provided or enabled internal to the sensor.

BACKGROUND ON THE INVENTION

Fingerprint sensing is now widely used for identification and verification purposes. For this, a person's fingerprint is acquired by a fingerprint sensing device whose output is processed and compared with stored characteristical data of one or more fingerprints to determine whether a match exists. Most optical fingerprint sensing apparatuses incorporate a prism and take advantage of a frustrated total internal reflection (FTIR) effect to image the fingerprint, such as is described in U.S. Pat. Nos. 2,195,699 and 5,416,573. In the prior art, the need to block ambient light from a fingerprint scanning device is considered to be an important issue and multiple solutions have been proposed. For example, in U.S. Pat. No. 7,119,889 an ambient light shield comprising a cover that sits over the platen is suggested where said cover blocks ambient light of the wavelengths used by the fingerprint scanner to image a fingerprint. As a second example, contact fingerprint scanner based upon FTIR typically incorporate a spectral filter, typically a series of dielectric films on a glass substrate, such that the filter behaves as a bandpass filter. As such, said filter allows light used by the fingerprint scanner to pass through to the sensor of the scanner and light outside of this spectral band, e.g., ambient light, is blocked.

An alternative to a FTIR fingerprint scanner is a contact fingerprint scanner. As described in U.S. Pat. Nos. 5,991,467 and 7,369,690, optically sensing of a fingerprint may also be performed using a photoelectric sensor 20 such as described in and shown schematically for example in FIG. 1. The prior art describes backlight illumination 21a from a source 21 is transmitted through transparent regions of array 20a to strike a finger 22 that is placed on a platen 23. In regions where the ridges 8 of the fingerprint make contact with platen 38, the light transmits into the finger, scatters (ray 25) and is detected by a two-dimensional (2D) array of light sensitive detectors 24. The valleys 7 of the fingerprint of finger 22 when in contact with fingerprint sensor 20 create an air boundary that reflects illumination (ray 28) and reflected light does not get detected by light sensitive detectors 24. The remaining illumination light impinging of areas of fingerprint valleys transmits to the skin and although some is reflected, a significantly reduced amount of light returns to the light sensitive detectors in comparison with that of the ridges and hence an image of the fingerprint consisting of ridges and valleys is created. The light sensitive detectors 24 each have a capacitor or capacitance which stores the accumulated charge of the detector 24 in accordance with the amount of the reflected light 25 the detector 24 receives. The amount of the light 25 received into each of the light sensitive detectors 24 differs according to its position from which the light is reflected because a reflectance between a light 25 reflected from a ridge 8 portion that is protruded portion of the finger, and a light 28 reflected from a valley 7 portion that is recessed portion of the finger 22 is different from each other, where the ridges and valleys of FIG. 1 have been drawn in an exaggerated scale in order to clarify the operation of the device. Transistors 26 are provided for each of the detectors 24. Each transistor 26 switches to readout out the amount of the electron charge stored in the capacitor of its associated detector 24. These switching transistors 26 may be thin film transistors known as TFTs, and light sensing detectors 24 may be thin-film based PIN photodiodes.

Platen 23 may be provided by the surface of a thin protective layer 27 over a substrate or transparent backplane 29 having detectors 24, and other electronics, including transistors 26, electrical connections, and other elements, typical of TFT-based sensors for enabling their operation. Fabrication of sensor 20 may use amorphous silicon technology formed on a backplane 29 of glass. Backlight illumination 21 passes through substrate 29 and the non-opaque areas (e.g., areas that do not contain detectors 24, transistors 26, electrical connections and other elements) upon substrate 29. Detectors 24 are opaque on the side facing substrate 29 so that illumination light 21a from source 21 cannot be directly detected, but only detected because of a reflection or scattering.

Detectors 24 are referred to hereinafter as light sensing pixel elements (or pixels) 24 of the two dimensional sensor array 20a, since each detector senses light in accordance with one pixel (when readout by other electronics on the chip of sensor 20) of a two-dimensional image representative of a fingerprint of the subject finger 22 or finger(s), palm, thumb, or other skin of a person. Since the finger 22 is in close proximity to the light sensing pixels of array 20a, no imaging optics are used, thus the term of a device using this photoelectric sensor to capture a fingerprint image is referred herein as a non-imaging contact fingerprint sensor 20, where such sensor has a two-dimensional sensor array 20a of light sensing pixels. Fingerprint contact sensors where TFTs provide transistors 26 are referred to herein as TFT-based fingerprint contact sensors. However, heretofore the improvements provided by the present invention, a commercially useful non-imaging contact fingerprint sensor has not been successfully developed for use in fingerprint scanners. Such being desirable since avoiding the need for imaging optics of a FTIR fingerprint scanner would enable the scanner to be more compact and lightweight, especially useful for mobile fingerprint scanners.

For a fingerprint sensor that is based upon a non-imaging contact approach as depicted in FIG. 1, such sensor is significantly more compact and lightweight than FTIR fingerprint sensors, a plus for mobile applications, however, another general requirement for any mobile application is to have as low as possible power consumption so as to maximize life of a battery typically present. One source of drain on such battery in the scanner's internal illumination source, such as shown by illumination 21 in FIG. 1. It thus would be desirable to provide a non-imaging contact sensor which does not require internal illumination for operation, or that use of an internal illumination source is optional, thereby lowering overall power consumption of the scanner.

SUMMARY OF THE INVENTION

Accordingly, one object of the present invention is to provide non-imaging contact sensors which can utilize ambient illumination and thereby reduce or eliminate the need for an internal illumination source.

It is another object of the present invention to provide non-imaging contact sensors which utilize and guides ambient light when present in order to reduce the power consumption of the fingerprint scanners utilizing such sensors.

A further object of the present invention is to provide non-imaging contact sensors having an optional internal illumination for capturing fingerprint images where the internal illumination is partially on (enabled) to add to the ambient light present, or completely on (enabled) when little or no ambient light is present in order to capture suitable fingerprint images.

Briefly described, the present invention embodies a non-imaging contact sensor having an upper surface, and a one-dimensional (1D) or two-dimensional (2D) array of light sensing pixel elements (or pixels) for receiving light representative of the topology of skin illuminated by at least redirected ambient light received within the sensor through the upper surface upon which such skin is located. Such redirection of the ambient light within the sensor increases or enhances the amount of ambient light in the sensor which may otherwise be received, so as to provide illumination of skin along the upper surface or platen of the sensor that can enable the pixel elements to receive reflected/scattered part of such illumination representative of the topology of the skin, such as a fingerprint in the case of a finger upon the upper surface.

The upper surface or platen of the sensor may be part of a layer of material of the sensor to protect the array of pixel elements. Skin may be located upon the platen, such as the bottom of finger(s), thumb, palm, or toe, or other desired skin area(s). The array is disposed below the platen and sized in accordance with the desired skin topology to be captured by the sensor.

The sensor has a backplane substrate having a front surface upon which are disposed the light sensing elements and other electronics enabling operation thereof. In order to enable redirection of ambient light within the sensor, one or more layers or coatings of the same or different materials are provided in the sensor for redirecting ambient light received within the sensor by one or more of reflection, scattering, or propagation towards the platen. For example, the back surface of the substrate may a coating or layer of material that reflects and/or scatters ambient light incident thereto towards the platen that had passed to the back surface of the substrate through at least the upper surface and the substrate. In another example, reflective coating may be provided along the back or front of light sensing elements and other electronics enabling their operation, or layers of materials over the substrate provide a waveguide that allows ambient light received within the sensor to propagate laterally and illuminate the skin, where the platen is provided by the surface of uppermost layer of the waveguide. One benefit of a reflective coating being provided upon light sensing pixel elements is that it allows control over the ambient light for applications where a lot of ambient light is expected that might otherwise saturate the light sensing pixel elements.

The platen is preferably provided by the protective layer of material which may have locations or areas outside where skin is locatable and thus where light sensing pixel elements below such protective layer are not needed. To increase the amount of ambient light received within the sensor, an optical element may be provided below such locations or areas of the protective layer to pass or guide ambient light received via the protective layer into the substrate so that it may then be redirected within the sensor such as by the above described reflective coating along the back surface of the substrate. Multiple one of such optical element may be provided, if desired.

Preferably, the pixel elements are sensitive to one or more selected wavelengths or wavelength ranges of the ambient light present. For example, light sensitivity of the sensor may be set or tuned to peak ambient light wavelengths or wavelength ranges, such as red and infrared (or near IR), where strong ambient light at these wavelengths transmit through the skin of the one or more fingers and expose the sensor. Further it is preferably that the light sensing pixel elements have a fill factor that avoids or minimizes the risk of saturation of the light sensing pixels by ambient light, and/or controlled pixel integration times in accordance with the level of ambient light that may reach the light sensitive pixels.

Optionally, the sensor may have an internal illumination source(s) which are operated when ambient light is insufficient to enable sensor operation. For example, the source may provide illumination to the substrate, such as via one side thereof between the front and back substrate surfaces. In this case, at least the above described reflective or scattering material along the substrate's back surface is present for directing light from the source towards the platen. In another example, the source may provide illumination through the substrate's back surface, which then does not have reflective or scattering material thereupon. When an internal illumination source is present the sensor is operable in a first mode in which the light sensing pixel elements receives light representative of topology of skin illuminated by redirected ambient light and the source is not enabled, and in a second mode where the source is enabled to provide all or additional illumination to illuminate the skin when ambient illumination present is absent or inadequate to enable proper sensor operation.

The present invention further embodies an apparatus (or system) for capturing one or more fingerprints having a sensor with an array of non-imaging light sensing pixels for receiving light representative of one or more fingerprints, and a housing having a platen for placement of one or more fingers of a subject, in which the array is disposed below the platen and ambient light is receivable via the platen to enable operation of the light sensing pixels to receive light representative of the one or more fingerprints. Such housing may further have light source(s) which provide illumination to the platen when the ambient light received via the platen cannot provide illumination to enable the light sensing pixels to adequately receive light representative of one or more fingerprints.

A controller (or processor) may be provided in the housing for operating the sensor and receiving images there from. When an internal illumination source is present, the controller responsive to a received image from the sensor indicative that the ambient light is not sufficient (or separate ambient light sensor) to enable the light sensing pixels to adequately receive light representative of one or more fingerprints, and then operates the light source(s) to provide all or supplemental light to the sensor sufficient to enable adequate fingerprint images. In other words, in the case of a sensor having internal illumination source(s), the controller controls the operation of the sensor in one of the first and second modes in accordance with received signals from light sensing pixel elements, or signals from an ambient light sensor disposed near the platen which enables the controller to measure the amount of ambient light present.

A method is also provided by the present invention having the steps of receiving ambient light, redirecting within the sensor the ambient light received to an upper surface (or platen) to illuminate skin when present upon the upper surface, and receiving a reflected part of the redirected ambient light upon a 1D or 2D array of light sensing pixel elements representative of the topology of the skin. If an internal illumination source is provided, the method further operates such light source to provide internal illumination within the sensor to enable the light sensing pixel elements to operate when the ambient light is inadequate to carry out the receiving step.

Although the present invention describes non-imaging sensors utilizing TFT-based sensor arrays, some of the above proposed sensor modifications are applicable to large area CMOS or CCD sensors.

The non-contact fingerprint sensor shown in the figures herein have been simplified for purpose of illustration, and thus are drawn schematically to show their operation. Examples of light or illumination described in connection with figures are depicted as arrows or ray lines.

BRIEF DESCRIPTION OF THE DRAWINGS

The foregoing and other objects, features and advantages of the invention will become more apparent from a reading of the following description in connection with the accompanying drawings in which:

FIGS. 4 and 5 are referred to herein in connection with discussion of the third embodiment of the present invention;

DETAILED DESCRIPTION OF THE INVENTION

Figure 2A:
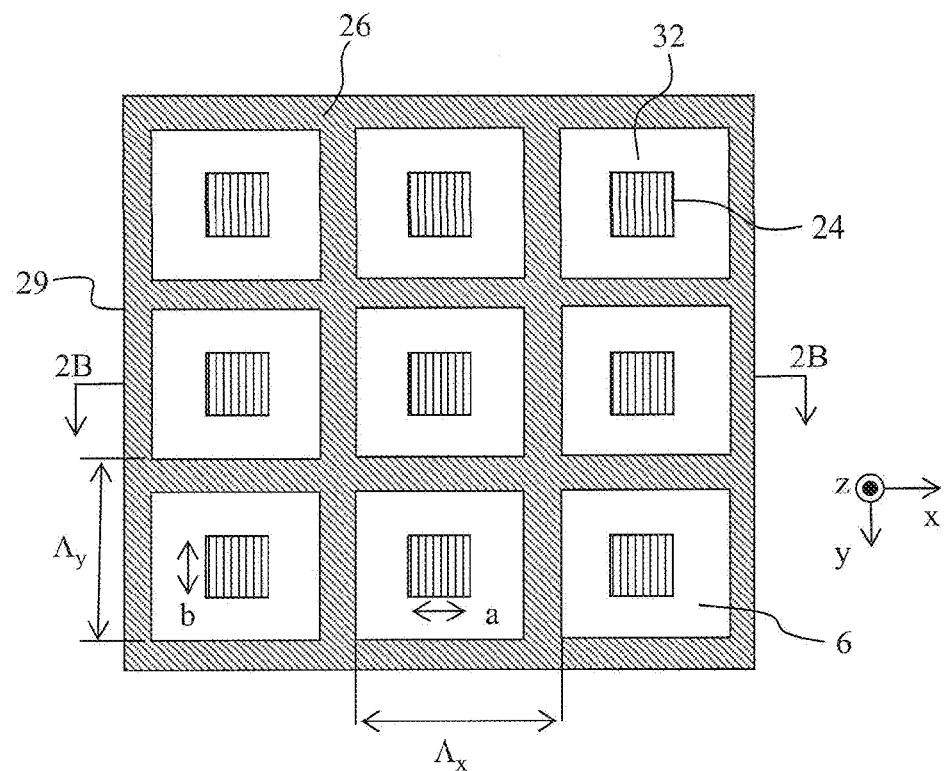
FIG. 2A is a top-down schematic view of a portion of 2D TFT-based sensor array in accordance with a first embodiment of the present invention.
Figure 2B:
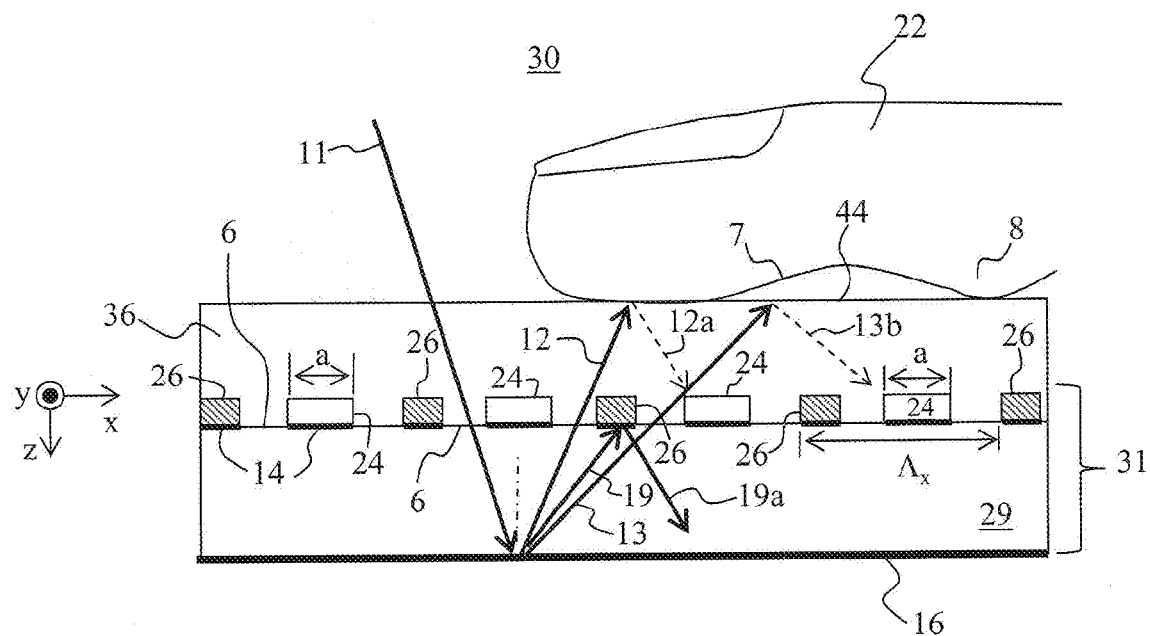
FIG. 2B is a cross-section of the sensor of FIG. 2A along lines 2B-2B.

Referring to FIGS. 2A and 2B, a non-imaging contact sensor 30 in accordance with a first embodiment of the present invention is shown having a two-dimensional array 31 of light sensing pixel elements (or pixels) 24 which is the same or similar as shown in array 20a, as described earlier, with the improvement of each light sensing pixel 24 having a reduction of the fill factor. For the case of a TFT sensor, there is optionally the increase in transparency regions 6 allowed by the reduction in fill factor of the light sensing pixels 24.

Figure 1:
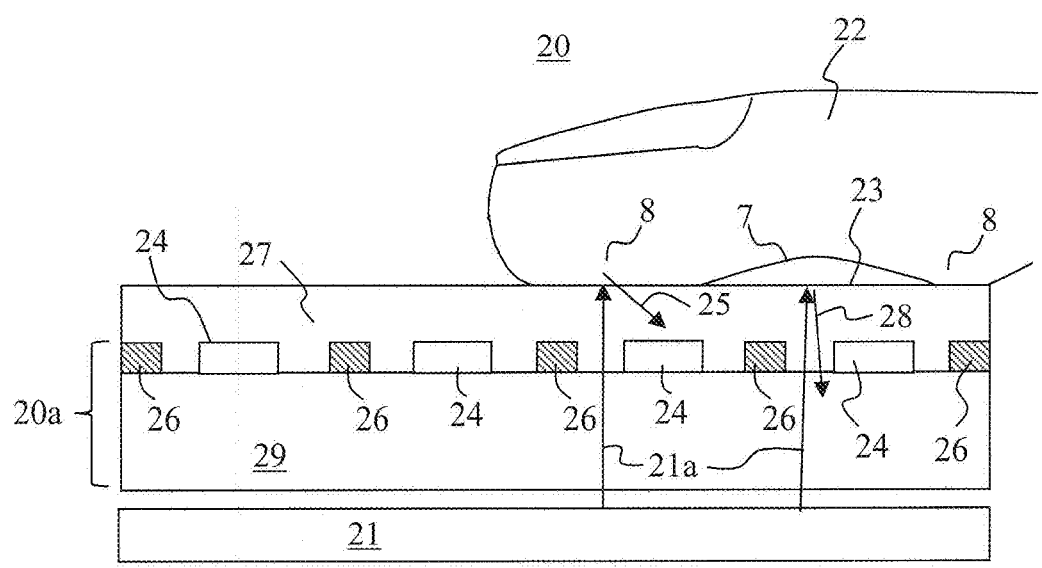
FIG. 1 is a schematic cross-section of part of a TFT-based sensor of the prior art showing use in the case of imaging a fingerprint.

As stated earlier, sensor arrays 20a of FIG. 1 may be fabricated using thin-film transistor (TFT), CMOS or other technology. Regardless of the technology used to fabricate the 2D optical sensor array 20a, there will be photosensitive regions 24 as well as regions that are used for the pixel and drive/read electronics, which includes but is not limited to transistors 26. For fingerprint scanning applications, the desire is to have ≥250 ppi (points per inch) for low-security biometric applications (e.g., computer or cell-phone logins) and ≥500 ppi for fingerprint applications involving AFIS (Automated Fingerprint Identification System) databases where hardware scanner certifications are required by organizations such as the United States (U.S.) Federal Bureau of Investigation (FBI). By way of example, for a fingerprint scanner that must be FBI-certified for 500 ppi resolution, the pixel pitch in the x and y directions, ($\Lambda_x$ and $\Lambda_y$, respectively) may be set equal to 50.8±0.5 μm (500 ppi±1%) or may be set to a smaller pixel pitch, for example 40 μm (635 ppi) and the final image downsampled to 500 ppi before it electronically enters the AFIS database.

Considering FIG. 2A geometry, the fill factor of the sensor array 30 is defined by the ratio of the active area ("a" by "b") of the light sensing pixel 24 divided by the total area ($\Lambda_x$ by $\Lambda_y$) of the site, which is equal to $a \cdot b/(\Lambda_x \cdot \Lambda_y)$. The regions 6 of array 31 that is not consumed by photosensitive regions 24 and electronics 26 has a direct and transparent path to the backplane 29. For the case of CMOS and CCD arrays, the backplane is silicon and hence not transparent to visible light, however in the case of a TFT array, backplane 29 is preferably made of glass and hence transparent to visible light.

The current market for large-pixel, large-area sensors is the digital X-ray market. Large-pixel (>70 μm), large area (>2" square) sensors fabricated with a scintillation layer (see, for example TFT-based sensors fabricated by DPIX of Palo Alto, Calif. or CMOS-based sensors by Dexela Limited of London, England), have as large a fill factor as possible since the X-ray source is not very intense (for health reasons), the X-ray to green light conversion efficiency of the scintillation layer is not particularly efficient, and ambient light (containing X-ray radiation) is not a concern. In fact some companies for digital mammography imaging where pixels tend to be the smallest of any digital X-ray application (typically in the 70 to 100 μm range), have developed TFT sensor fabrication technology wherein the PIN photodiode is fabricated on top of the pixel transistors and drive/read lines, thereby allowing for essentially 100% fill factor and therefore 0% transparency regions 6. Reducing the fill factor is thus contrary to the typical use of large area sensor arrays for producing digital X-ray images as well as high-end photography (terrestrial and space), since both applications require maximum sensitivity and therefore maximum sensor fill factor. Additionally both applications do not require any regions of transparency.

However, in accordance with the first embodiment of the present invention for fingerprint scanning applications, the reverse of the current trend for high fill factor and transparency is provided, namely that because of the possibility of the light sensing pixels 24 being saturated by ambient light in sensor that utilizes ambient light, that the fill factor of the sensor's array may be purposely reduced and in fact be in the region of <40%, or even <30% or <20%. By reducing the fill factor one reduces the amount of ambient illumination received by the light sensing pixels 24 of sensor array 31 as well as allow for an increase in the transparency of regions 6. Thus, according to this embodiment, light sensing pixels 24 with a fill factor (sensitive pixel area to total pixel area) smaller than 40% may be selected at manufacture of the sensor array 31 and thus increase the transparency of the array (i.e. regions 6) may be greater than 20%. In this manner, undesirable ambient light saturation of the light sensing pixels 24 can be avoided or minimized, as well as allowing for increased desired ambient light to be steered up through the backside of the sensing pixel's plane through the increased transparent regions 6.

FIG. 2B illustrates a cross-section of the array of sensor 30 depicted in FIG. 2A along line 2B-2B. Ambient light ray 11 is shown transmitting through protective layer 36 to transparent region 6 and into the backplane substrate 29, which as previously mentioned for a TFT array is preferentially glass. Light ray 11 then strikes coating 16 that is at or along the backside of backplane 29 which reflects ambient light 11. By way of example, coating 16 may be a smooth reflective coating fabricated of a metal such as aluminum or silver that has a high reflectivity at the wavelengths of operation of the device. With a smooth coating, ambient light ray 11 will reflect specularly into ray 12 and enable some of the incident ambient to reach underneath the finger 22 and in contact with platen 44 such that a portion of the reflected/scattered light 12a representing a fingerprint is detected by one of light sensitive pixels 24. Alternatively, or in addition to, coating 16 may be scattering such that incident ambient light ray 11 may reflected in a variety of scattered rays 13 and 19, in addition to or in lieu of specular reflection ray 12. These scattered rays 13 and 19 may strike the fingerprint topology (ridges 8 and valleys 7) of finger 22 and a portion of the rays 13b scattered/reflected from the interface at platen 44 are detected by light sensitive pixels 24. Coating 16 may randomly scatter incident light in all directions, such as would be achieved if white paint were used, or a more controlled scattering may be achieved through the use of Fresnel structures, diffractive optics, holographic optics, or surface relief structures. Alternatively, a dielectric stack layer may be used rather than coating 16 that performs the same reflective function. Thus, backplane substrate 29 has a back surface having a layer or coating 16 of material which redirects by reflecting and/or scattering ambient light received within the sensor, via at least the platen 44 and substrate 29, back towards the platen 44 to illuminate the skin of finger 22.

Another coating 14 may also be present in sensor 30. This coating 14 lies between (i.e., along the back surface thereof) of light sensing pixels 24, transistors 26 or other non-transparent elements (or electronics) of array 31, and front surface of backplane surface 29 as shown in FIG. 2B. Coating 14 preferably reflects ambient light and the reflection may be specular such as which is achieved with a dielectric coating stack or a metal coating, but may also be scattering as previously described in reference to the coating 16. Coating 14 enhances the amount of light present for fingerprint illumination by reflecting ambient light 19 that does not make it through transparency regions 6 into light 19a such that it has another opportunity to reflect off of coating 16 and find its way through transparency regions 6 in order to illuminate the finger 22 that is placed upon platen 44. The use of coating 16, with or without coating 14, thus enhances the amount of ambient light redirected to platen 44, and as a result more ambient light can be returned to the light sensing pixels 24 representing fingerprint topology.

Figure 3:
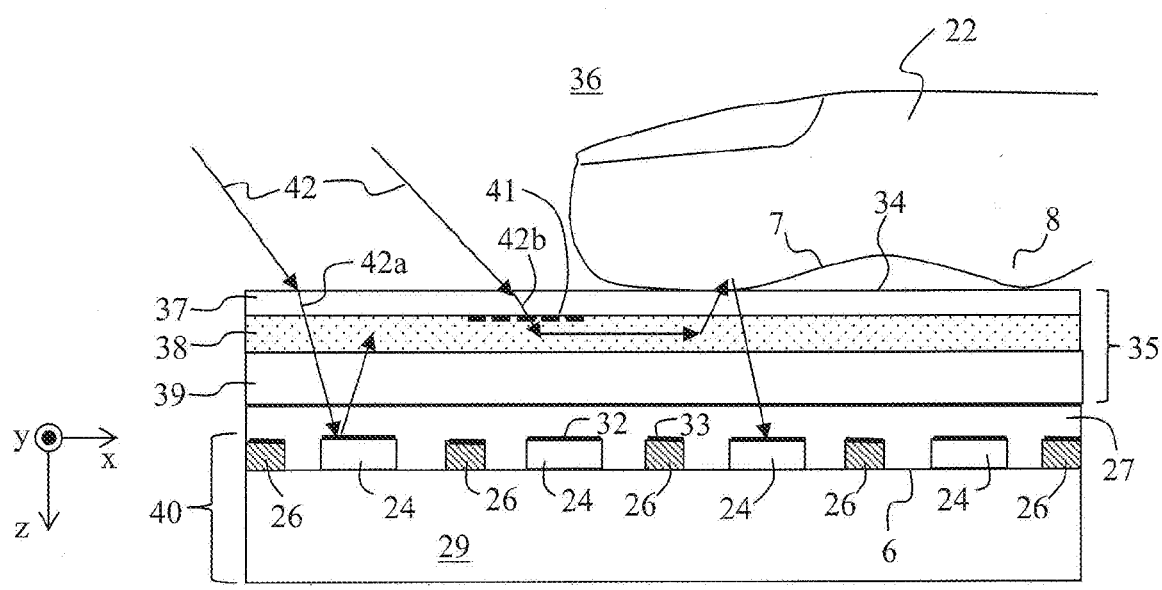
FIG. 3 is a schematic cross-section of a portion of 2D TFT-based sensor in accordance with a second embodiment of the present invention.

Referring to FIG. 3, a second embodiment of the present invention of a non-imaging contact sensor 36 is shown having three additional layers 37, 38 and 39 on top of a protective layer 27, otherwise the sensor array 40 is the same or similar to sensor array 20a described earlier. A platen 34 in sensor 36 is provided by the upper surface of layer 37. Layers 37, 38, and 39 forms a waveguide 35 that allows ambient light to propagate laterally and thereby go underneath finger 22. In order for ambient light to be "captured" by waveguide 35 and guided in the waveguide core 38, there must be scattering or diffraction events. Scattering can be achieved through encounters of ambient light 42 with electrical components 26, but may also be helped by diffractive or Fresnel structures 41. Structures 41 may be located outside of area allotted for finger placement so that the finger is never placed directly above structures 41, or structures 41 may only excite a waveguide mode based upon a certain range of ambient angles which are not generally the same angles used for imaging the fingerprint and they therefore do not interfere with the imaging ability of light upon the sensor's light sensing pixels 24. By way of example, the structures 41 may be holographic structures Bragg matched for a set of ambient illumination angles, separate from those angles used for imaging onto light sensing pixels 24. Light that is guided by the waveguide 35 is disrupted by the presence of an index of refraction similar to that of skin such that the light normally guided by the waveguide interacts with the skin and scatter downwards towards light sensitive pixels 24. Waveguide 35 is illustrated in FIG. 3 with the addition of 3 layers, coatings 37, 38, and 39, but may constructed with more or less coatings, provided it still functions in the method described above.

Separately, or in addition to, materials providing reflective coatings 32 and 33 may be applied to array 40 of sensor 36 as shown in FIG. 3. Reflection coating 32 is a coating that may be applied to light-sensitive elements 24. Since the coating is on the light-sensitive element, it is partially reflective which has the advantage of increasing the amount of light that remains inside of the sensor layers above light-sensitive element 24 and therefore has a chance of "tunneling" underneath the finger 22. Coating 32 also allows for a certain amount of control over the ambient light for applications where a lot of ambient light is expected that might otherwise saturate the sensor. The reflection value of coating 32 is a tradeoff between the sensitivity of pixel 24, the amount of ambient light present, and the ability for ambient light to tunnel under the finger 22. Coating 33 is applied to the electronic areas of array 40. This coating may be the same as coating 32, but need not be because since coating 33 is on top of electronic components it can be made potentially 100% reflective. Thus, the waveguide 35 and/or reflective coatings 32 and 33 enhances the amount of light by channeling ambient light to platen 34 (i.e., underneath the ridges and valleys of the finger 22 lying there against), and as a result more ambient light received within the sensor can be redirected to platen 34 to illuminate skin of finger 22 and then returned to the light sensing pixels 24 representing fingerprint topology.

Figure 4:
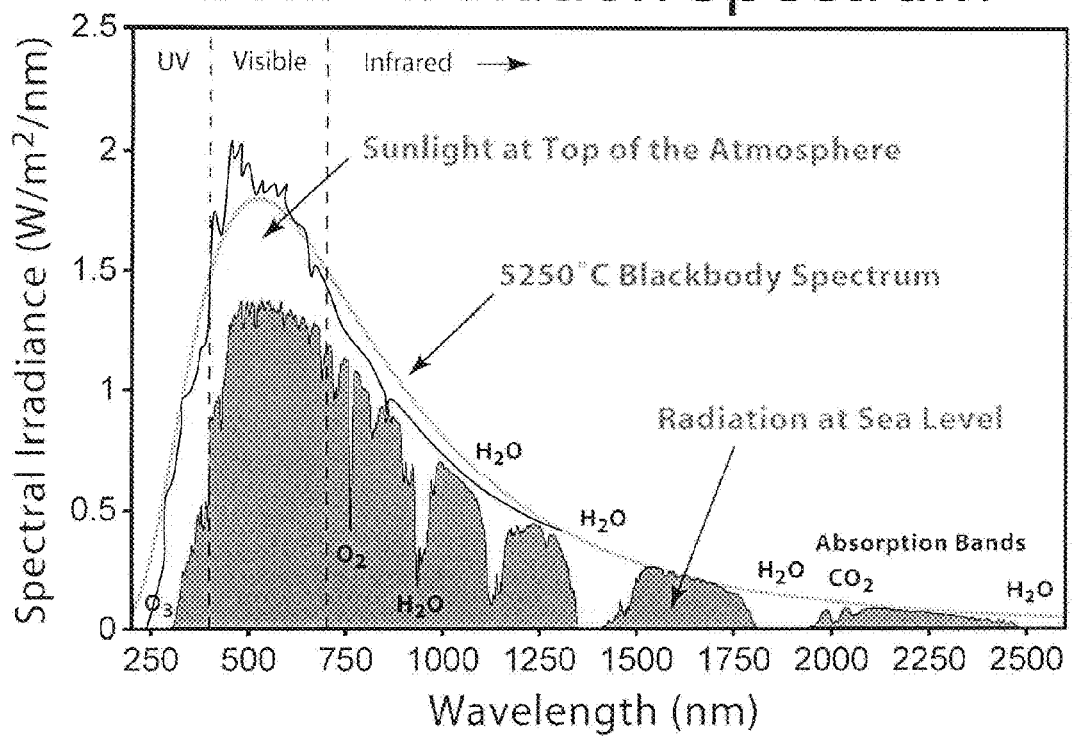
FIG. 4 is a plot of the solar radiation spectrum.
Figure 5:
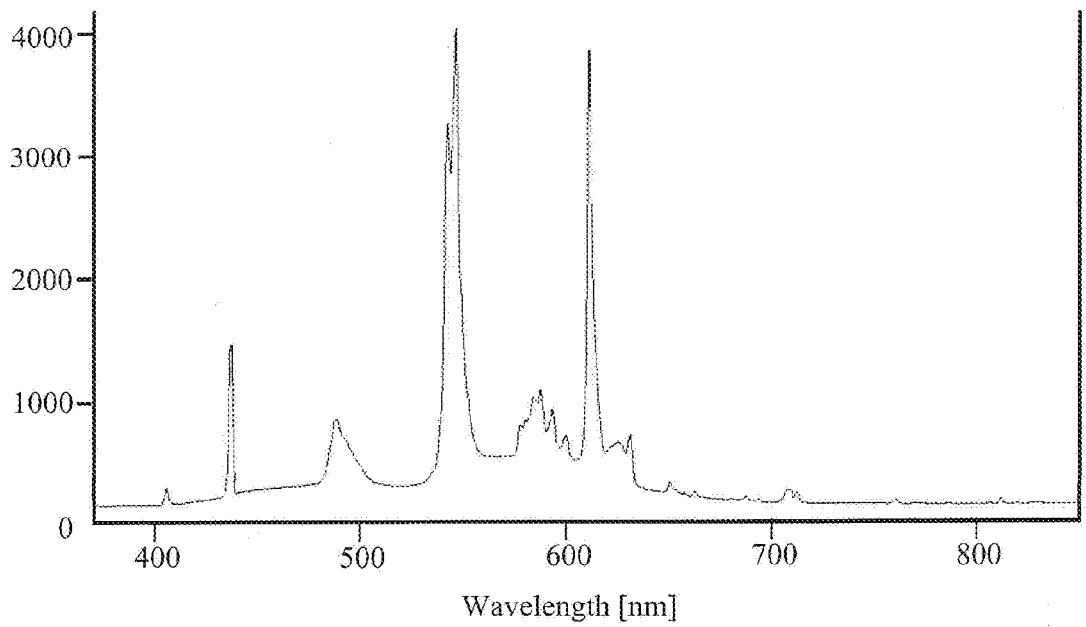
FIG. 5 is a plot of the output intensity spectrum of a typical fluorescent light bulb, where

In a third embodiment of the present invention, the sensor's wavelength of operation of its light sensing pixels 24 of sensor 20, or any other of the sensors of the other embodiments herein, is in a spectral region where there is significant ambient light. To be more exact, it is preferred that sensors 30, 36, 60, 70, or 104 operate in a spectral region where the product of the ambient light intensity multiplied by the responsivity of the sensor is maximized (which may or may not be the wavelength of peak intensity of the ambient light), without saturation of the sensor pixels taking place. Illustrated in FIGS. 4 and 5 are the spectra for sunlight and for fluorescent lights, respectively (obtained from www.wikipedia.com). For a contact optical fingerprint scanner illuminated with ambient fluorescent lights (e.g., typical office overhead lighting), it is desired that the sensor pixels 24 are sensitive to visible light (400-700 nm), but if not possible, the sensor pixels 24 should be sensitive to at least the 550 nm or 620 nm peaks of the fluorescent spectrum or preferably both 550 nm and 620 nm portions of the fluorescent light spectrum. For a contact optical fingerprint scanner operating in sunlight or outdoor light, due to the strength of sunlight, it may be preferred to operate in the full visible portion of the spectrum (400-750 nm) where the light intensity is strongest, but if pixel saturation is a risk, operating at wavelengths outside of this may be desirable. It is also possible to utilize a wavelength where the skin touching platen 34 is reasonably transmissive, for instance in the red and Near IR. Ambient light at these wavelengths may cause skin to glow and such glow can be detected by light sensing pixels 24. In this manner, the sensor is tuned to selected light sensitivity within the ambient light spectrum. In other words, light sensing pixels 24 are provided in the array of the sensor which operates responsive to selected wavelength(s) or band(s) associated with spectral content of the ambient light presented to the sensor.

Figure 6:
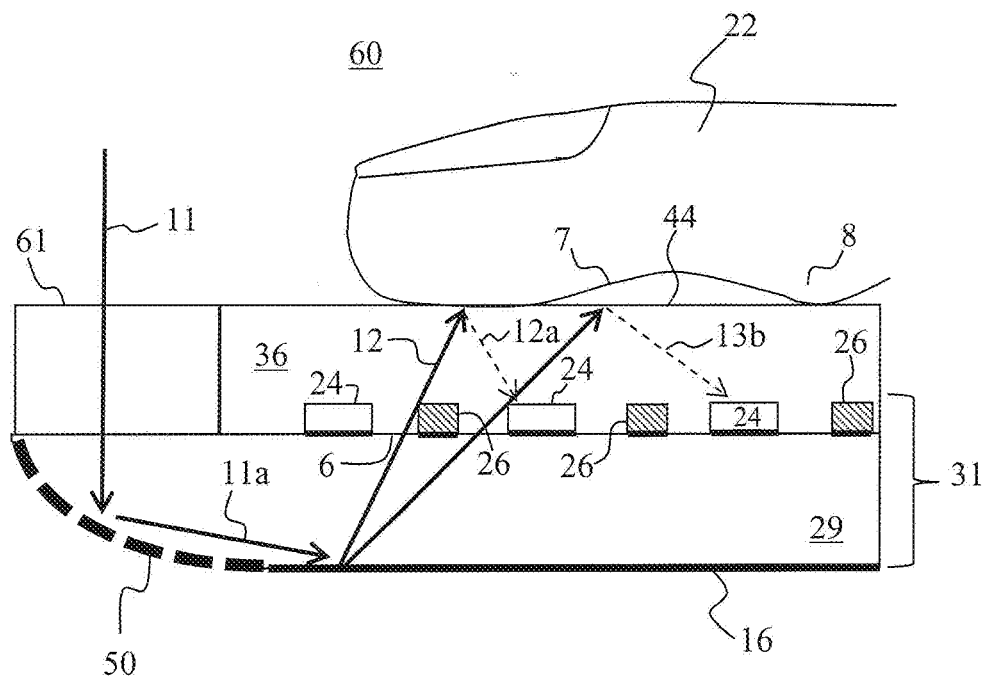
FIG. 6 is a schematic cross-sectional view of a portion of 2D TFT-based sensor in accordance with a fourth embodiment of the present invention.

FIG. 6 depicts a fourth embodiment of the present invention showing a fingerprint sensor 60 that brings ambient light in from locations or area 61 along protective layer 36 not over light sensing pixels 24 (or other electronics) where the finger 22 will not be present. Ambient light can be directly channeled underneath the finger via area 61 through the use of an optical element 50. Optical element 50 may be a simple mirror (plano or curved), a Fresnel, a diffractive element, a holographic element, or other element or combination of elements that guides ambient light to illuminate a large enough portion of reflective coating 16, such that more ambient light is directed to illuminate the finger 22 from below. Sensor 60 is shown in FIG. 6 as having array 31 of sensor 30 (FIG. 2B) with coating 16 along the back surface of backplane 29. In this manner, optical element 50 below area 61 can enhance the amount of ambient light that can be returned to the light sensing pixels 24 representative of the fingerprint by guiding more of the ambient light within sensor to illuminate finger 22. The fill factor reduction of sensor pixels 24 or coating 14 of array 31 described earlier is optional in sensor 60. Although a single location 61 is shown, multiple areas may have optical elements 50, such as providing, for example, a light pipe to increase the amount of ambient light in sensor 60. Although not shown in FIG. 6, ambient light 11 may also be received via platen 44 as shown in FIG. 2B.

Figure 7:
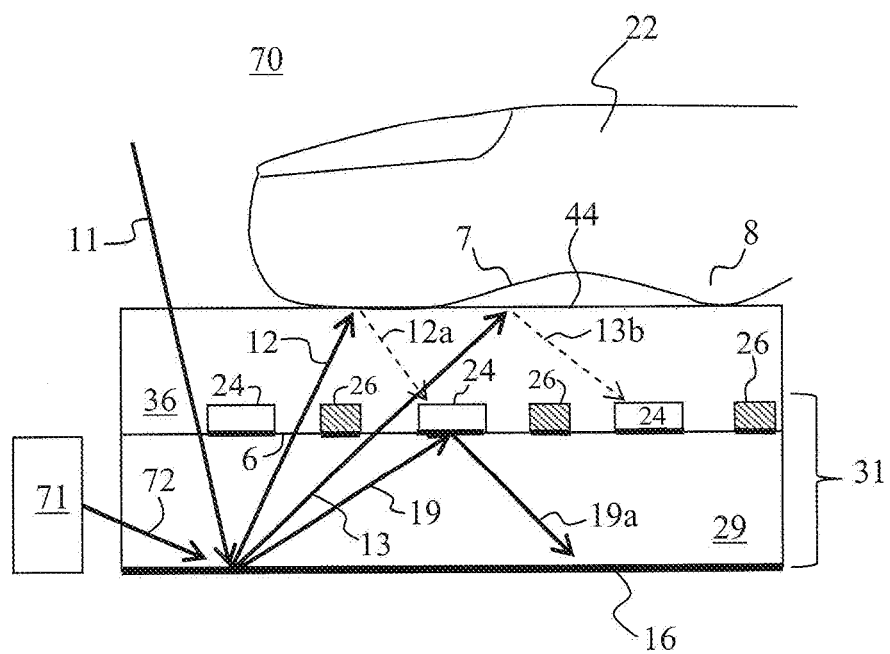
FIG. 7 is a schematic cross-section of a portion of 2D TFT-based sensor in accordance with a fifth embodiment of the present invention.

FIG. 7 depicts a fifth embodiment of the present invention showing a fingerprint sensor 70 having an internal light source 71. Sensor 70 is shown as having array 31 of sensor 30 (FIG. 2B) with coating 16 along the back surface of backplane 29. The fill factor reduction of sensor pixels 24 or coating 14 of array 31 described earlier is optional. Light source 71 illuminates the edge of backplane 29 to illuminate via light rays 72 the reflective coating 16. As described before in reference to ambient light in FIG. 2B, reflective coating 16 may be a specular or a scattering coating where in either case, the coating reflect both ambient light 11 and internal illumination 72 to the underside of finger 22 such that the light reflected/scattered at or near platen 44 is detected by light-sensitive pixels 24. The light source 71 is utilized when the ambient light 11 has insufficient power to capture an adequate fingerprint image. Thus, the sensor 70 has a light source 71 along a side or surface of said substrate not having the material of coating 16.

In a fingerprint scanner, the determination as to whether ambient light 11 has insufficient power to capture an adequate fingerprint image may be provided by a controller or programmed processor 118 (such as described later in connection with FIG. 9) of a fingerprint scanner which controls scanner operation, including, but not limited to light source 71 and sensor 70. Controller 118 can detect when ambient light 11 has insufficient power to capture an adequate fingerprint image. For example, controller 118 (or computer system 130) may determine this in accordance with the values of the pixels of the image provided to the controller from sensor 70, such that a percentage, average, or other statistic (or spatial) distribution of pixel values in the image may be compared to threshold(s) indicative of insufficient ambient illumination (e.g., under exposure), or controller 118 may analyze fingerprint topology to determine if fingerprint is of insufficient quality due to inadequate platen illumination (e.g., an insufficient area of the fingerprint captured, an insufficient number of minutiae points detected). If so, then controller 118 enables light source 71 to turn on from an off state during image capture by light scanning pixels 24, and may also set the level of illumination from light source 71 to the amount of light needed to supplement the ambient light and thereby improve the quality of the image obtained. After an image is acquired, the light source 71 may be turned off by controller 118. The determination of sufficient ambient light being present without need for light from light source 71 may be conducted by the controller 118 using sensor 70 prior to image capture (ambient light detection mode) or periodically, or after each fingerprint scan (where if the ambient light is insufficient, scanning is automatically repeated with additional or sole illumination from light source 71). Other internal illumination means providing light to platen 44 may also be used rather than light source 71. Thus, sensor 70 can be considered as being operable in a first mode by controller 118 in which light sensing pixels 24 receives light representative of the topology of skin illuminated by the ambient light that is redirected internally in the sensor (such as described earlier in connection with sensors 30 or 36) and source 71 is disabled or off, and in a second mode where source 71 is enabled or on by controller 118 to provide all or such additional illumination to such ambient light received within sensor 70 to enable proper sensor operation.

Figure 8:
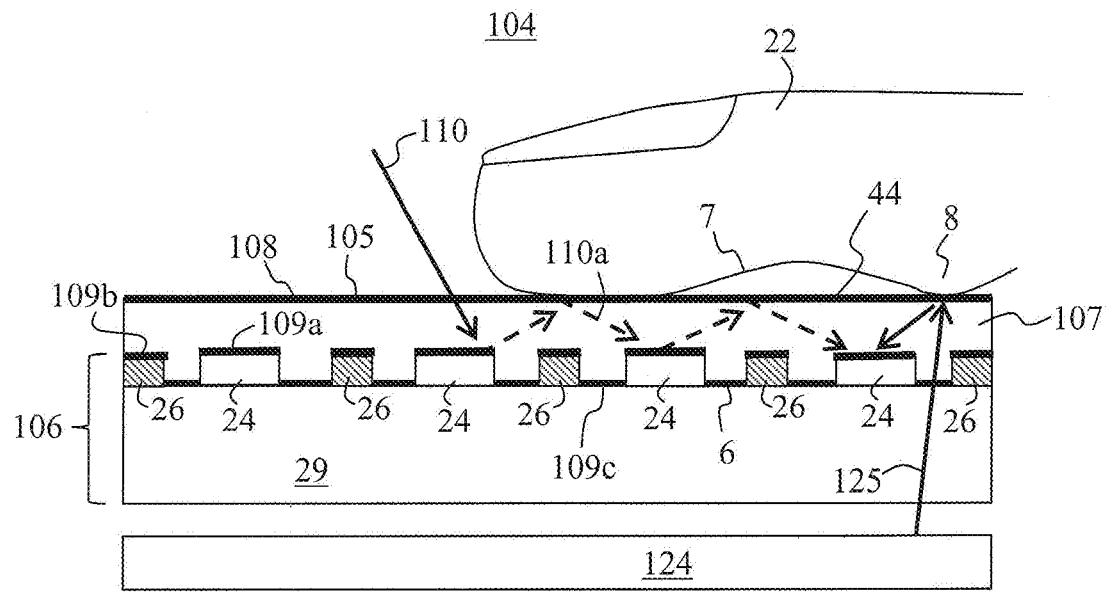
FIG. 8 is a schematic cross-section of a portion of 2D TFT-based sensor in accordance with an sixth eighth embodiment of the present invention.

FIG. 8 depicts a sixth embodiment of the present invention showing a non-imaging contact sensor 104 where finger 22 with a fingerprint comprising a series of valleys 7 and ridges 8 (representing the topology of the skin of the finger) is placed onto platen 44. Platen 44 is optionally comprised of an anti-reflective (AR) coating 108 that allows as much ambient light 110 into the sensor as possible. The light sensitive pixels 24 have a coating 109a and electronics 26 have a coating 109b, where such coatings may function in the same manner as described in reference to coatings 32 and 33, respectively, of FIG. 3. Transparency regions 6 along the front surface of backplane substrate 29 have a coating 109c. A backlight (or illumination source) 124 and illumination ray 125 is provided for providing illumination (depicted by ray 125) along the back surface of backplane substrate 29 as shown in FIG. 8, such backlight 124 may be operated in the same manner as described in the case of sensor 70 by controller 118. For the case of backplane 29 being silicon such as is the case for array 106 made using CCD or CMOS technology, the coating 109c could be made 100% reflective and backlight 124 and illumination ray 125 would not be present. For the case where the backplane 29 is glass, such as in the case of array 106 using amorphous Si TFT technology, coating 109c can be made partially reflective or selectively reflective such that internal backlighting 124 may be used when it is determined that sufficient ambient light 110 is not available for the capture of a fingerprint image of sufficient quality (such as by a controller as described earlier in connection with FIG. 7). A partially reflective coating 109c may be fabricated using a dielectric stack or a very thin metallic layer. Alternatively a selective coating may be used that illumination light 125 of a certain spectral and angular range is transmitted but ambient light is reflected. By way of example, sensor 104 may operate in ambient fluorescent light and therefore since most of the energy in the ambient light is >450 nm and <750 nm, that coating 109c has high reflection for that spectral region, but it may be desired to simultaneously have low reflection for wavelengths <450 nm. If it is determined that the ambient fluorescent lights are not strong enough, then backlight 124 can emit light 125 at wavelengths <450 nm (e.g., using a 430 or 405 nm LED) and therefore coating 109c also transmits well at those wavelengths. Similarly for a mobile scanner operating with ambient sunlight, the sensor 104 may also operate in one mode based on ambient sunlight with wavelengths >450 nm and to operate in another mode based upon internal illumination (when sunlight is not present or not present in sufficient power) that is at wavelengths of <450 nm. Again the purpose of coatings 109a, 109b, and 109c are to reflect as much of the ambient light as possible in order to guide it underneath finger 22.

The switching from modes of use of ambient light to the use of internal illumination (as depicted in FIGS. 7 and 8) need not be a binary decision. Rather in order to minimize the amount of electrical power expended, the internal illumination may be turned on to a partial level where said partial level is sufficient such that combined with the available ambient light that a fingerprint image of sufficient quality is captured. In his manner, use of coatings 108, 109a, 109b, and/or 109c enhances the amount of ambient light that can be returned to the light sensing pixels 24 representative of the fingerprint by guiding more of the light underneath the finger 22. However, internal illumination source(s) may less preferably be used as determined by controller 118 without structures for ambient light enhancement as describe here or in the other embodiments.

In summary, the sensor may have one or more layers, coatings, or other structures that increase (or enhance) the amount of ambient light received within the sensor that tunnel, channel, travel underneath, or otherwise illuminates the fingerprint topology of the finger lying against a platen, and thereby increase the amount of ambient light reflected/scattered at or near the platen (representative of the fingerprint topology) detected by light-sensitive pixels. Such one or more structures may be provided by one or more of: (i) an antireflection (AR) coating on top of the platen, or any protective layer or other layers that is above the sensor's array such that increased ambient light penetrates into the sensor; (ii) a reflective layer (smooth or structured) on top of the light sensitive pixels' detection areas; (iii) a reflective layer on top of the electronics (e.g., switching transistors or other non-light sensing components of the array); (iv) a reflective layer (smooth or structured) on the backside of the sensor's backplane, (v) a waveguiding layer preferably in conjunction with structures for directing ambient light into such waveguiding layer where the waveguiding layer; and/or (v) area(s) along the platen 44 not designated for any finger through which ambient light can be pass, via an optical element into the sensor (preferably by reflection by the structure of (iv)) such that the one or more fingers are illuminated from below. In the case of a smooth AR or reflective layer, the layer may be a series of dielectric layers. For the smooth reflective layer, the layer may be a combination of metals, dielectric, and holographic layers. For the case of a structured reflective layer, the layer may be rough and randomly scattering or it may be specifically structured through the use of Fresnel optics, microlenses, or diffractive optics in order to scatter light appropriately.

Figure 9:
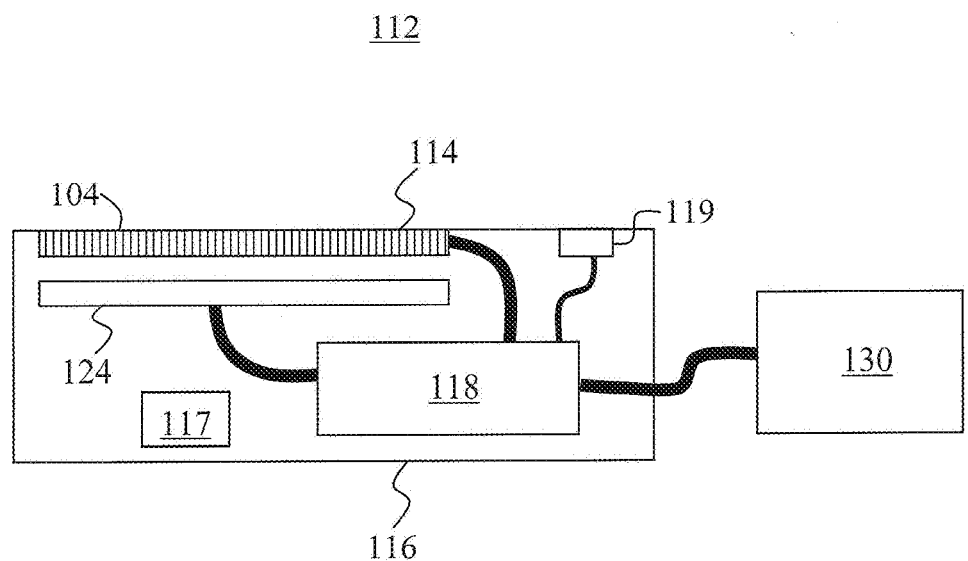
FIG. 9 is a block diagram of a fingerprint scanner system using a TFT-based sensor having the sensor of FIG. 8.

FIG. 9 is a block diagram of a fingerprint imaging apparatus or system 112 using for example sensor 104 of FIG. 8. A housing 116 is provided having an aperture or opening 114 for locating sensor 104, where the surface of sensor 104 provides a platen, and such sensor 104 uses back-light illumination source 124 when needed as described above in connection with FIGS. 7 and 8. Signals representative of a two-dimensional fingerprint(s) are processed by a controller or processor 118 to provide a fingerprint image to computer 130 for fingerprint identification, verification, or enrollment. Computer system 130 also has a display and user interface (e.g., keyboard, touch screen or mouse) and represents a computer system typical of a fingerprint imaging apparatus, and is programmed to control the operation of apparatus 112 for capturing fingerprints. Optionally all or part of the processing and control provided by computer system 130 may be provide by the controller 118 or other processor(s) in housing 116 with a suitable user interface. A battery 117 is shown such as may be used for supplying power to components of apparatus 112 when the apparatus is a mobile fingerprint scanner, or when external an power source is not available.

To enable other embodiments of the present invention, backlight 124 is omitted from housing 116 and sensor 30, 36, or 60 used rather than sensor 104. Or, backlight 124 may be omitted and instead an illumination source provided similar to source 71 of FIG. 7, and sensor 70 used instead rather than sensor 104. Such sensors 30, 36, 60, 70, and 104 may also have ambient light spectral sensitivity such as described in connection with FIGS. 4 and 5 of the third embodiment. Use of the improved sensors described herein enables reduced power consumption by eliminating the need for internal illumination, or when a source for internal illumination is present only enabling the source to provide illumination for sensor as needed when ambient light is insufficient.

When optional internal light source(s) are present in housing 116, rather than the processing by controller 118 to determine under exposure of an image due to inadequate illumination, an ambient light sensor 119 (e.g., photodiode) may be present along near the platen which outputs data or signal to controller 118 for determining (or measuring) the level of ambient light, which when too low (below a threshold level) operates the light source 71 during image capture to enable adequate fingerprint image quality.

Also, in any the above embodiments, or even sensor 20, the controller 118 may control the integration times of the light sensitive pixels 24 which are varied in order to accommodate the different levels of ambient light that may reach the light sensitive pixels 24. Integration times increase to an interval sufficient to capture more ambient light when ambient light detected is low (e.g., zero or insufficient light on light sensing pixels 24), and decrease to an interval to capture less ambient light when ambient light detected is too high (e.g., light sensing pixels 24 are all or partially saturated). Control of integration time of the light sensing pixels 24 thus is another way to avoid or minimize partial saturation, when such is detected by the controller in an image received from a sensor. The same image analysis may be provided by the controller 118 as use in determining inadequate ambient illumination (i.e., under exposure due to low or zero charge on light sensing pixels) to determine when to increase integration time. Further, the same image analysis may be used by the controller 118 as for determining inadequate ambient illumination but using threshold(s) indicative of over exposure, rather than under exposure, and thereby avoid or minimize all or partial saturation (high charge) on the light sensing pixels 24. Again, optionally data from an ambient light sensor 119 may be used to determine the level of ambient illumination, and the integration time of the light sensing pixels controlled in response to such level to enable optimal image acquisition.

The arrays 31, 40, and 106 (or array 20 operating in accordance with the third embodiment) may be based upon a 2D TFT array such as manufactured by DPIX of Palo, Alto, Calif., U.S.A. These DPIX 2D TFT arrays range in area from 2" by 2" to 19" by 19" with 100-200 μm resolution, and are currently used in digital x-ray scanners, but heretofore are not believed utilized in a sensor for a fingerprint scanner. For example, a DPIX flat panel amorphous Silicon (a-Si) x-ray image sensor may have a 30×40 $cm^2$ active area, 127 μm resolution, and 7.4 megapixels. For more information on DPIX arrays and sensors, see for e.g., R. L. Weisfield, M. A. Hartney, R. A. Street, and R. B. Apte, "New Amorphous-Silicon Image Sensor for X-Ray Diagnostic Medical Imaging Applications", SPIE Vol. 3336, Medical Imaging 1998. Physics of Medical Imaging, 22-24 Feb. 1998, pp. 444-452. Other photoelectric sensors which are non-imaging utilize CMOS sensors, such as manufactured by Dexela in London, England. Although each embodiment is set forth separately, two or more of the embodiments may be combined.

Although the sensor is described as a two-dimensional array of non-imaging light sensing pixels, a one-dimensional array of non-imaging light sensing pixels may also be used with the embodiments described herein. Additionally, arrays 31, 40, 106, having sensing pixels 24 are shown as including the backplane substrate 29, however such arrays, and their associated electronics and data lines, may be considered as being disposed on the front surface of the substrate 29 as shown in the figures and not inclusive of the substrate.

It should be understood that the word fingerprint or finger is meant to refer to not just a fingerprint or a finger but rather to any skin topology and any type or portion of skin (for example fingers, thumbs, palms, toes, etc.).

From the foregoing description, it will be apparent that there has been provided improved non-imaging contact finger print sensors. Variations and modifications in the herein described sensor, and method of use will undoubtedly suggest themselves to those skilled in the art. Accordingly, the foregoing description should be taken as illustrative and not in a limiting sense.

The invention claimed is:

1. A sensor for capturing finger print images comprising:
an array of light sensing pixel elements for receiving light representative of one or more fingerprints, said array including a set of transparency regions; and
a housing having a platen as an upper surface and configured for placement of one or more fingers, in which said array is disposed below said platen, and wherein a surface of a backplane is disposed below said array, and wherein
ambient light that is received via said platen, travels through said platen and through said set of transparency regions located within said array, and reflects off of a backplane that is configured for specular reflection of said ambient light, and where said ambient light travels from said backplane and back through said transparency regions and through said platen and towards said fingers placed upon said platen, causing reflection of said ambient light off of said fingers and causing travel of said reflection of ambient light towards one or more of said light sensing pixel elements, so that light representative of one or more fingerprints of said fingers is received by light sensing pixel elements.

2. The sensor of claim 1 wherein said pixel elements are separated by minimum first distance and wherein a proximity of said pixel elements to said platen is equal to about one half of said minimum first distance.

3. The sensor of claim 1 further comprising a substrate having an upper surface upon which is disposed said array of pixel elements, and wherein said substrate having a lower backplane surface made from a first material configured to redirect light through said substrate and towards said upper surface.

4. The sensor, of claim 3 wherein said substrate includes a second material disposed between said upper surface and said lower backplane surface for redirecting ambient light incident thereto by one or more of reflection or scattering.

5. The sensor according to claim 3 further comprising at least, one optical element provided below an area of said upper surface and not below where said fingers are located, in which said optical element guides ambient light received via said area to said substrate for redirection by said optical element.

6. The sensor according to claim 3 further comprising an illumination source that is disposed between said upper and lower surfaces, in which said sensor is operable in a first mode in which said array of light sensing pixel elements receives light representative of a fingerprint via redirected ambient light while said illumination source is disabled, and said sensor is operable in a second mode wherein said illumination source is enabled to provide light to the sensor in addition to said ambient light.

7. The sensor according to claim 6 further comprising a controller for controlling operation of said sensor in one of said first and second modes in accordance with received signals from light sensing pixel elements.

8. The sensor according to claim 6 further comprising an ambient light sensor and a controller for controlling operation of said sensor in one of said first and second modes in accordance with signals from said ambient light sensor.

9. The sensor according to claim 1 wherein a fill factor is selected to limit or minimize risk of saturation of said light sensing pixel elements by ambient light incident thereto.

10. The sensor according to claim 9 said fill factor is less than 40%.

11. The sensor of claim 1 further comprising a substrate having an upper surface upon which is disposed said array of pixel elements, and a plurality of layers of material forming a waveguide that allows ambient light received within the substrate to propagate laterally and illuminate fingers disposed upon said upper surface.

12. The sensor according to claim 1 wherein each of said light sensing pixel element operates over an integrate time in receiving light incident thereto, in which said integration time is selected in accordance with the level of ambient light reaching the light sensitive pixel elements.

13. The sensor according to claim 1 wherein said light sensing pixel elements are sensitive to one or more selected wavelengths or wavelength ranges of said ambient light present.

14. The sensor of, claim 1 wherein said pixel elements are separated by minimum first distance of 40-50 microns and wherein a proximity of said pixel elements to said platen is equal to about 20-25 microns.

15. A method for capturing, finger print images comprising the steps of;
   providing a sensor including an array of light sensing pixel elements for receiving light representative of one or more fingerprints, said array including a set of transparency regions; and including
   a housing having a platen as an upper surface and configured for placement of one or more fingers, in which said array is disposed below and in close proximity to said platen, and wherein a surface of a backplane is disposed below said array, and wherein
   ambient light that is received via said platen, travels through said platen and through said set of transparency regions located within said array, and reflects off of a backplane that is configured for specular reflection of said ambient light, and where said ambient light travels from said backplane and back through said transparency regions and through said platen and towards said fingers placed upon said platen, causing reflection of said ambient light off of said fingers and causing travel of said reflection of ambient light towards one or more of said light sensing pixel elements that are located in close proximity to said reflection, so that light representative of one or more fingerprints of said fingers is received by light sensing pixel elements that are located in close proximity to said reflection.

* * * * *